United States Patent
Dyer et al.

(10) Patent No.: US 8,110,464 B2
(45) Date of Patent: Feb. 7, 2012

(54) SOI PROTECTION FOR BURIED PLATE IMPLANT AND DT BOTTLE ETCH

(75) Inventors: Thomas W. Dyer, Pleasant Valley, NY (US); Herbert L. Ho, New Windsor, NY (US); Ravi M. Todi, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 564 days.

(21) Appl. No.: 12/048,291

(22) Filed: Mar. 14, 2008

(65) Prior Publication Data

US 2009/0230508 A1  Sep. 17, 2009

(51) Int. Cl.
*H01L 21/8242* (2006.01)

(52) U.S. Cl. ........ 438/243; 257/301; 257/346; 438/149; 438/386; 438/479

(58) Field of Classification Search .................. 257/347, 257/301, E21.013, 258, 396, 652, E27.096; 438/149, 479, 517, 243, 386

See application file for complete search history.

(56) References Cited

U.S. PATENT DOCUMENTS

| | | | |
|---|---|---|---|
| 3,387,286 A | | 6/1968 | Dennard |
| 5,276,338 A | * | 1/1994 | Beyer et al. ..................... 257/52 |
| 5,442,584 A | * | 8/1995 | Jeong et al. .................. 365/149 |
| 5,770,484 A | * | 6/1998 | Kleinhenz ..................... 438/155 |
| 5,811,315 A | * | 9/1998 | Yindeepol et al. ............ 438/405 |
| 6,552,381 B2 | * | 4/2003 | Chittipeddi et al. .......... 257/301 |
| 6,566,177 B1 | * | 5/2003 | Radens et al. ................ 438/152 |
| 6,977,227 B2 | | 12/2005 | Lin et al. |
| 7,009,237 B2 | * | 3/2006 | Adkisson et al. ............. 257/301 |
| 7,087,486 B2 | | 8/2006 | Brown et al. |
| 7,132,324 B2 | | 11/2006 | Cheng et al. |
| 2002/0119638 A1 | * | 8/2002 | Wilson et al. ................. 438/424 |
| 2003/0068867 A1 | * | 4/2003 | Forster et al. ................. 438/386 |

* cited by examiner

*Primary Examiner* — Thao Le
*Assistant Examiner* — Eric Jones
(74) *Attorney, Agent, or Firm* — Joseph P. Abate; Howard M. Cohn

(57) ABSTRACT

An SOI layer has an initial trench extending therethrough, prior to deep trench etch. An oxidation step, such as thermal oxidation is performed to form a band of oxide on an inner periphery of the SOI layer to protect it during a subsequent RIE step for forming a deep trench. The initial trench may stop on BOX underlying the SOI. The band of oxide may also protect the SOI during buried plate implant or gas phase doping.

13 Claims, 7 Drawing Sheets

SOI PROTECTION FOR BURIED PLATE IMPLANT AND DT BOTTLE ETCH

FIELD OF THE INVENTION

The invention relates to semiconductor devices and, more particularly to dynamic random access memory (DRAM), including embedded DRAM (eDRAM) and, more particularly to etching a deep trench (DT) for the cell capacitor.

BACKGROUND OF THE INVENTION

A memory cell in an integrated circuit (IC) may include a transfer device such as a transistor and an associated capacitor. The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals. One type of transistor is known as the field effect transistor (FET).

The capacitor, which is typically formed in a portion of a trench, consists of a pair of conductive plates (electrodes), which are separated from each other by a node dielectric material. Information or data is stored in the memory cell in the form of charge accumulated on the capacitor. Since capacitors leak charge (generally, a capacitor is only useful for temporarily storing an electrical charge), the information (data) eventually fades unless the capacitor charge is refreshed (read and re-written) periodically, such as every 64 ms (milliseconds).

DRAM (eDRAM)

Generally, the DRAM cells discussed herein comprise a capacitor formed in a deep trench (DT) in a substrate, and an "access transistor" formed on the surface of the substrate adjacent and atop the capacitor. The capacitor ("DT capacitor") generally comprises a first conductive electrode called the "buried plate" which is a heavily doped region of the substrate surrounding the trench, a thin layer of insulating material such as oxide lining the trench, and a second conductive electrode such as a heavily doped polycrystalline plug (or "node") disposed within the trench. The transistor may comprise a FET having one of its source/drain (S/D) terminals connected to (or an extension of) the second electrode (node) of the capacitor.

FIG. 1 illustrates a DRAM cell 100 of the prior art, generally comprising an access transistor and an associated cell capacitor. The DRAM cell is generally formed, as follows.

Beginning with a semiconductor substrate 102, a deep trench (DT) 110 is formed, extending into the substrate 102, from a top (as viewed) surface thereof. The substrate 102 may comprise a SOI substrate having a layer 106 of silicon (SOI) on top of an insulating layer 104 which is atop the underlying silicon substrate 102. The insulating layer 104 typically comprises buried oxide (BOX). The deep trench (DT) 110 is for forming the cell capacitor (or "DT capacitor"), as follows. The trench 110 may have a width of about 50 nm to 200 nm and a depth of 1000 nm to 10000 nm, by way of example.

The cell capacitor generally comprises a first conductor called the "buried plate" which is a heavily doped region 112 of the substrate surrounding the trench 110, a thin layer 114 of insulating material lining the trench 110, and a second conductor 116 such as a heavily doped polycrystalline plug (or "node", "DT poly") disposed within the trench 110. A cell transistor ("access transistor") 120 may comprise a FET having one of its source/drain (S/D) terminals connected to (or an extension of) the second conductor (node) of the capacitor, as follows.

The FET 120 comprises two spaced-apart diffusions, 122 and 124, within the surface of the substrate 102—one of which will serve as the "source" and the other of which will serve as the "drain" (D) of the transistor 120. The space between the two diffusion areas is called the "channel" (and is approximately where the legend "SOI" appears). A thin dielectric layer 126 is disposed on the substrate above the channel, and a "gate" structure (G) 128 is disposed over the dielectric layer 126, thus also atop the channel. (The dielectric under the gate is also commonly referred to as "gate oxide" or "gate dielectric".) The gate 128 may be a portion of an elongate wordline (WL).

In modern CMOS technology, shallow trench isolation (STI) is commonly used to isolate one (or more) transistors from other transistors, for both logic and memory. As shown in FIG. 1, a shallow trench 132 may be formed, surrounding the access transistor 120 (only one side of the transistor is shown). Note that the trench 132 extends over the DT (node) poly 116, a top portion of which is adjacent the drain (D) of the transistor 120. Therefore, the trench 132 is less deep (thinner) over the DT poly 116 and immediately adjacent the drain (D) of the transistor 120, and may be deeper (thicker) further from the drain (D) of the transistor 120 (and, as shown, over top portion of the DT poly 116 which is distal from (not immediately adjacent to) the drain (D) of the transistor 120.

The STI trench 132 may be filled with an insulating material, such as oxide (STI oxide) 134. Because of the thin/thick trench geometry which has been described, the STI oxide will exhibit a thin portion 134a where it is proximal (adjacent to) the drain (D) of the transistor 120, and a thicker portion where it is distal from (not immediately adjacent to) the drain (D) of the transistor 120.

As illustrated in FIG. 2, the deep trench (DT) may be "bottle-shaped", such that it is wider in the substrate under the BOX, and a thinner bottleneck portion of the trench extends through the BOX (and overlying SOI, not shown). The deep trench is typically filled with poly (DT Poly, compare 116), there is a lining of insulator (compare 114), and the trench is surrounded by the buried plate (compare 112). This forms deep trench capacitor, which is generally not limited to SOI.

SOI Substrates

Silicon on insulator technology (SOI) refers to the use of a layered silicon-insulator-silicon substrate in place of conventional silicon substrates in semiconductor manufacturing, especially microelectronics. SOI-based devices differ from conventional silicon-built devices in that the silicon junction is above an electrical insulator, typically silicon dioxide or (less commonly) sapphire. The choice of insulator depends largely on intended application, with sapphire being used for radiation-sensitive applications and silicon oxide preferred for improved performance and diminished short channel effects in microelectronics devices. The precise thickness of the insulating layer and topmost silicon layer also vary widely with the intended application.

SiO2-based SOI substrates (or wafers) can be produced by several methods:
- SIMOX—Separation by IMplantation of OXygen—uses an oxygen ion beam implantation process followed by high temperature annealing to create a buried SiO2 layer.
- Wafer Bonding—the insulating layer is formed by directly bonding oxidized silicon with a second substrate. The majority of the second substrate is subsequently removed, the remnants forming the topmost Si layer.

Seed methods—wherein the topmost Si layer is grown directly on the insulator. Seed methods require some sort of template for homoepitaxy, which may be achieved by chemical treatment of the insulator, an appropriately oriented crystalline insulator, or vias through the insulator from the underlying substrate.

Related Patents and Publications

U.S. Pat. No. 3,387,286 (IBM; 1968) discloses field effect transistor memory. The memory is formed of an array of memory cells controlled for reading and writing by word lines and bit lines which are connected to the cells. Each cell is formed using a single FET and a single capacitor. The gate electrode of the FET is connected to the word line, the source terminal is connected to the bitline, and the drain terminal is connected to one of the (two) electrodes of the capacitor. The other electrode of the capacitor is connected to a reference potential. Information is stored by charging the capacitor through the transistor, and information is read out by discharging the capacitor through the transistor. During a "write" operation, the wordline which is connected to the gate of the transistor is energized to render the transistor conductive between source and drain. If a "zero" is to be stored, the bitline is not energized and the capacitor is not charged. If a "one" is to be stored, the bitline is energized and the capacitor is charged to substantially the potential (voltage) of the bitline signal. During "read" operations, only the wordline is energized and a signal is transmitted to the bit lie if a "one" has been stored previously (the capacitor is charged). Since the charge on the capacitor leaks off, it is necessary to periodically regenerate the information stored in the memory.

U.S. Pat. No. 6,977,227 (2005), incorporated by reference herein, discloses a method for forming a bottle trench. First, a substrate covered by a photoresist layer is rotated to a specific angle prior to performance of lithography, thereby forming a rectangular opening in the photoresist layer and exposing the substrate, in which edges of the rectangular opening are substantially parallel to the {110} plane of the substrate due to the rotation of the substrate. Next, the exposed substrate is etched to form a trench therein, in which the sidewall surface of the trench is the {110} plane of the substrate. Finally, isotropic etching is performed on the substrate of the lower portion of the trench using an etching shield layer formed on the sidewall of the upper portion of the trench as an etching mask, to form the bottle trench. There is also disclosed a method of fabricating a bottle trench capacitor. As noted in this patent, one method employed to increase capacitance is to widen the lower portion of a trench, thus, increasing the surface area and creating a "bottle shaped" capacitor.

U.S. Pat. No. 7,132,324 (IBM, 2006), incorporated by reference herein, discloses SOI device with different crystallographic orientations. A method of forming a memory cell having a trench capacitor and a vertical transistor in a semiconductor substrate includes a step of providing a bonded semiconductor wafer having a lower substrate with an [010] axis parallel to a first wafer axis and an upper semiconductor layer having an [010] axis oriented at forty-five degrees with respect to the wafer axis, the two being connected by a layer of bonding insulator; etching a trench through the upper layer and lower substrate; enlarging the lower portion of the trench and converting the cross section of the upper portion of the trench from octagonal to rectangular, so that sensitivity to alignment errors between the trench lithography and the active area lithography is reduced. An alternative version employs a bonded semiconductor wafer having a lower substrate formed from a (111) crystal structure and the same upper portion. Applications include a vertical transistor that becomes insensitive to misalignment between the trench and the lithographic pattern for the active area, in particular a DRAM cell with a vertical transistor.

U.S. Pat. No. 7,087,486 (IBM, 2006), incorporated by reference herein, discloses method for scalable, low-cost polysilicon capacitor in a planar DRAM. Capacitor structures that have increased capacitance without compromising cell area are provided as well as methods for fabricating the same. A first capacitor structure includes insulating material present in holes that are formed in a semiconductor substrate, where the insulating material is thicker on the bottom wall of each capacitor hole as compared to the sidewalls of each hole. In another capacitor structure, deep capacitor holes are provided that have an isolation implant region present beneath each hole.

Glossary

Unless otherwise noted, or as may be evident from the context of their usage, any terms, abbreviations, acronyms or scientific symbols and notations used herein are to be given their ordinary meaning in the technical discipline to which the invention most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks®.

anisotropic literally, one directional. An example of an anisotropic process is sunbathing. Only surfaces of the body exposed to (facing in the direction of) the sun become tanned. Anisotropic means "not the same in all directions" or "not isotropic". See isotropic.

capacitor A capacitor is a two-terminal device (electrical or electronic component) that can store energy in the electric field between a pair of conductive electrodes (called "plates"). The process of storing energy in the capacitor is known as "charging", and involves electric charges of equal magnitude, but opposite polarity, building up on each plate.

CMP short for chemical-mechanical polishing. CMP is a process, using both chemicals and abrasives, comparable to lapping (analogous to sanding), for removing material from a built up structure. For example, after depositing and etching a number of elements, the top surface of the resulting structure may very uneven, needing to be smoothed (or levelled) out, prior to performing a subsequent process step. Generally, CMP will level out the high spots, leaving a relatively smooth planar surface.

CVD short for chemical vapor deposition. CVD is a chemical process used to produce high-purity, high-performance solid materials. The process is often used in the semiconductor industry to produce thin films. In a typical CVD process, the wafer (substrate) is exposed to one or more volatile precursors, which react and/or decompose on the substrate surface to produce the desired deposit. CVD is used to deposit materials in various forms, including: monocrystalline, polycrystalline, amorphous, and epitaxial. These materials include: silicon, oxide, nitride and metals, such as are commonly used in semiconductor fabrication.

deposition Deposition generally refers to the process of applying a material over another material (or the substrate). Chemical vapor deposition (CVD) is a common technique for depositing materials. Other "deposition" techniques, such as for applying resist or glass, may include "spin-on", which generally involves providing a stream of material to the substrate, while the substrate is spinning, resulting in a relatively thin, flat, evenly-distributed coating of the material on the underlying substrate.

dopant element introduced into semiconductor to establish either p-type (acceptors) or n-type (donors) conductivity; common dopants in silicon: for p-type—boron (B), Indium (In); for n-type—phosphorous (P) arsenic (As), antimony (Sb). Dopants are of two types—"donors" and "acceptors". N type implants are donors and P type are acceptors.

doping doping is the process of introducing impurities (dopants) into the semiconductor substrate, or elements formed on the semiconductor substrate, and is often performed with a mask (or previously-formed elements in place) so that only certain areas of the substrate will be doped. For example, doping is used to form the source and drain regions of an FET. An ion implanter is typically employed for the actual implantation. An inert carrier gas such as nitrogen is usually used to bring in the impurity source (dopant). Usually in doping, a dopant, a dosage and an energy level are specified and/or a resulting doping level may be specified. A dosage may be specified in the number of atoms per $cm^2$ and an energy level (specified in keV, kilo-electron-volts), resulting in a doping level (concentration in the substrate) of a number of atoms per $cm^3$. The number of atoms is commonly specified in exponential notation, where a number like "3E15" means 3 times 10 to the 15th power, or a "3" followed by 15 zeroes (3,000,000,000,000,000). To put things in perspective, there are about 1E23 (100,000,000,000,000,000,000,000) atoms of hydrogen and oxygen in a cubic centimeter (cm3) of water. An example of doping is implanting with B (boron) with a dosage of between about 1E12 and 1E13 atoms/$cm^2$, and energy of about 40 to 80 keV to produce a doping level of between 1E17 and 1E18 atoms/$cm^3$. ("/$cm^3$" may also be written "$cm^{-3}$")

DRAM short for dynamic random access memory. DRAM is a type of random access memory that stores each bit of data in a separate capacitor within an integrated circuit. Since real capacitors leak charge, the information eventually fades unless the capacitor charge is refreshed periodically. Because of this refresh requirement, it is a dynamic memory as opposed to SRAM and other static memory. Its advantage over SRAM is its structural simplicity: only one transistor and a capacitor are required per bit, compared to six transistors in SRAM. This allows DRAM to reach very high density. Like SRAM, it is in the class of volatile memory devices, since it loses its data when the power supply is removed.

eDRAM short for embedded DRAM. eDRAM is a capacitor-based dynamic random access memory usually integrated on the same die or in the same package as the main ASIC or processor, as opposed to external DRAM modules and transistor-based SRAM typically used for caches.

etching etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch.

Wet etch is performed with a solvent (such as an acid) which may be chosen for its ability to selectively dissolve a given material (such as oxide), while leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically.

Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

FET short for field effect transistor. The FET is a transistor that relies on an electric field to control the shape and hence the conductivity of a "channel" in a semiconductor material. FETs are sometimes used as voltage-controlled resistors. The terminals of FETs are designated source (S), drain (D) and gate (G).

isotropic literally, identical in all directions. An example of an isotropic process is dissolving a tablet in water. All exposed surfaces of the tablet are uniformly acted upon. (see "anisotropic")

lithography In lithography (or "photolithography"), a radiation sensitive "resist" coating is formed over one or more layers which are to be treated in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The pattered resist can then serve as a mask for the underlying layers which can then be selectively treated, such as to receive dopants and/or to undergo etching, for example.

mask The term "mask" may be given to a layer of material which is applied over an underlying layer of material, and patterned to have openings, so that the underlying layer can be processed where there are openings. After processing the underlying layer, the mask may be removed. Common masking materials are photoresist (resist) and nitride. Nitride is usually considered to be a "hard mask".

metallization Metallization refers to formation of metal contacts and interconnects in the manufacturing of semiconductor devices. This generally occurs after the devices are completely formed, and ready to be connected with one another. A first level or layer of metallization is usually referred to as "M1".

nitride commonly used to refer to silicon nitride (chemical formula $Si_3N_4$). A dielectric material commonly used in integrated circuit manufacturing. Forms an excellent mask (barrier) against oxidation of silicon (Si). Nitride is commonly used as a hard mask (HM).

n-type semiconductor in which concentration of electrons is higher than the concentration of "holes". See p-type.

oxide commonly used to refer to silicon dioxide ($SiO_2$). Also known as silica. $SiO_2$ is the most common insulator in semiconductor device technology, particularly in silicon MOS/CMOS where it is used as a gate dielectric (gate oxide); high quality films are obtained by thermal oxidation of silicon. Thermal SiO2 forms a smooth, low-defect interface with Si, and can be also readily deposited by CVD. Oxide may also be used to fill STI trenches, form spacer structures, and as an inter-level dielectric, for example.

plasma etching Plasma etching refers to dry etching in which semiconductor wafer is immersed in plasma containing etching species; chemical etching reaction is taking place at the same rate in any direction, i.e. etching is isotropic; can be very selective; used in those applications in which directionality (anisotropy) of etching in not required, e.g. in resist stripping.

poly short for polycrystalline silicon (Si). Heavily doped poly Si is commonly used as a gate contact in silicon MOS and CMOS devices.

p-type semiconductor in which concentration of "holes" is higher than the concentration of electrons. See n-type. Examples of p-type silicon include silicon doped (enhanced) with boron (B), Indium (In) and the like.

resist short for photoresist also abbreviated "PR". Photoresist is often used as a masking material in photolithographic processes to reproduce either a positive or a negative image on a structure, prior to etching (removal of material which is not masked). PR is usually washed off after having served its purpose as a masking material.

RIE short for Reactive Ion Etching. RIE is a variation of plasma etching in which during etching, the semiconductor wafer is placed on an RF powered electrode. The plasma is generated under low pressure (vacuum) by an electromagnetic field. It uses chemically reactive plasma to remove material deposited on wafers. High-energy ions from the plasma attack the wafer surface and react with it. The wafer takes on potential which accelerates etching species extracted from plasma toward the etched surface. A chemical etching reaction is preferentially taking place in the direction normal to the surface—in other words, etching is more anisotropic than in plasma etching but is less selective. RIE typically leaves the etched surface damaged. RIE is a very common etching mode in semiconductor manufacturing.

Si Silicon, a semiconductor.

SI units The International System of Units (abbreviated SI from the French Le Systéme international d'unités) is the modern form of the metric system and is generally a system devised around the convenience of the number 10. It is the world's most widely used system of units, both in everyday commerce and in science. The SI system of units consists of a set of units together with a set of prefixes. There are seven "base units", which are meter (abbreviated "m", for length), kilogram (abbreviated "kg", for mass), second (abbreviated "s", for time), Ampere (abbreviated "A", for electric current), Kelvin (abbreviated "K", for thermodynamic temperature), mole (abbreviated "mol", for the amount of a substance), and candela (abbreviated "cd", for luminous intensity). A prefix may be added to the units to produce a multiple of the original unit. All multiples are integer powers of ten. For example, "kilo" denotes a multiple of a thousand and "milli" denotes a multiple of one-thousandth. Hence there are one thousand millimeters to the meter and one thousand meters to the kilometer.

SOI short for silicon-on-insulator. Silicon on insulator (SOI) technology refers to the use of a layered silicon-insulator-silicon substrate in place of a conventional silicon substrate in semiconductor manufacturing, especially microelectronics. SOI-based devices differ from conventional silicon-built devices in that the silicon junction is above an electrical insulator, typically silicon dioxide or (less commonly) sapphire.

Substrate typically a wafer, of semiconductor material such as silicon, germanium, silicon germanium, silicon carbide, and those consisting essentially of III-V compound semiconductors such as GaAs, II-VI compound semiconductors such as ZnSe. A substrate may also comprise an organic semiconductor or a layered semiconductor such as, for example, Si/SiGe, a silicon-on-insulator or a SiGe-on-insulator. A portion or entire semiconductor substrate may be amorphous, polycrystalline, or monocrystalline. A substrate is often covered by an oxide layer (sometimes referred to as a "pad oxide layer"). Pad oxide is usually relatively thin, e.g., in the range of about 50 to about 500 Angstroms (5-50 nm), and can be formed, for example, by thermal oxidation of the substrate. Pad oxide may also be prepared by other methods. For example, silicon dioxide or reactive precursors like silane could be deposited by chemical vapor deposition (CVD). A nitride layer (sometimes referred to as a "pad nitride layer") may be formed to protect the pad oxide and the underlying substrate during various processing steps. It usually has a thickness in the range of about 100 Angstroms to about 6000 Angstroms (10-600 nm), such as in the range of about 1500 Angstroms to about 3000 Angstroms (150-300 nm). Conventional means can be used to apply the pad nitride, such as chemical vapor deposition (CVD).

Transistor A transistor is a semiconductor device, commonly used as an amplifier or an electrically controlled switch. The transistor is the fundamental building block of the circuitry in computers, cellular phones, and all other modern electronic devices. Because of its fast response and accuracy, the transistor is used in a wide variety of digital and analog functions, including amplification, switching, voltage regulation, signal modulation, and oscillators. Transistors may be packaged individually or as part of an integrated circuit, some with over a billion transistors in a very small area. See FET.

Units of Length Various units of length may be used herein, as follows:
  meter (m) A meter is the SI unit of length, slightly longer than a yard.
    1 meter=~39 inches. 1 kilometer (km)=1000 meters=~0.6 miles.
    1,000,000 microns=1 meter. 1,000 millimeters (mm)=1 meter.
    100 centimeters (cm)=1 meter
  micron (µm) one millionth of a meter (0.000001 meter); also referred to as a micrometer.
  mil ¹/₁₀₀₀ or 0.001 of an inch; 1 mil=25.4 microns.
  nanometer (nm) one billionth of a meter (0.000000001 meter).
  Angstrom (Å) one tenth of a billionth of a meter. 10 Å=1 nm.

V short for voltage. Different voltages may be applied to different parts of a transistor or memory cell to control its operation.

wafer In microelectronics, a wafer is a thin slice of semiconducting material, such as a silicon crystal, upon which microcircuits are constructed. There are multiple orientation planes in the silicon crystal that can be used. The planes are defined by the "Miller Indices" methodology. Common orientations classified by the "Miller indices" are (100), (011), (110), and (111).

SUMMARY OF THE INVENTION

It is a general object of the invention to provide an improved technique for forming deep trenches (DTs), such as for capacitors of DRAM cells, in an SOI substrate. More particularly, it is an object of the invention to protect an SOI layer during deep trench etch, and/or buried plate implant.

According to the invention, generally, an SOI layer is protected from deep trench etch by a band (ring) of oxide disposed about the inner periphery of a trench extending through the SOI layer. The band of oxide extends around the inner periphery of a hole (initial trench) extending through the SOI layer to the deep trench (DT). And, the band of oxide may also protect the SOI layer during buried plate implant for forming a deep trench capacitor.

According to an embodiment of the invention, a method of protecting an SOI layer during deep trench etch, comprises: commencing with an SOI layer atop a BOX layer which is atop an underlying substrate into which a deep trench will be formed; forming an initial trench extending through the SOI layer, resulting in an opening in the SOI layer having an inner periphery; performing an oxidation step to protect the inner periphery of the SOI layer; and extending the initial trench into the substrate to form a deep trench. The initial trench may extend through the BOX layer, or may be extended when forming the deep trench. The extension of the initial trench to a deep trench may be performed using a reactive ion etch (RIE).

The oxidation step may comprise growing a band of oxide in an inner peripheral area of the SOI layer, and this may be thermal oxidation. Before the oxidation step, the SOI layer may first be pulled back.

A bottle etch may be performed to widen the deep trench within the underlying substrate. A buried plate may be formed in an area of the underlying substrate surrounding the deep trench. A thin insulating layer may be formed on the sidewall of the deep trench. The deep trench may be filled with doped poly. Ion implantation or gas phase doping may be performed to form a buried plate surrounding the deep trench.

According to an embodiment of the invention, a deep trench capacitor, comprises: an initial trench extending through a BOX layer and overlying SOI layer, thereby forming an opening through the SOI layer, the opening having an inner periphery; a deep trench extending from the initial trench into an underlying substrate; and band of oxide in an inner peripheral area of the SOI layer. The band of oxide may fill a widened portion of the opening in the SOI layer. The band of oxide may comprise thermal oxide.

The invention is generally applicable to any type of SOI substrate, such as SIMOX, Wafer Bonding and Seed method, as described above.

The invention is generally independent of any crystal orientation of the underlying substrate or SOI layer.

The invention is generally independent of subsequent access transistor type (design and layout), and may be useful for all DRAM and eDRAM in SOI substrates.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
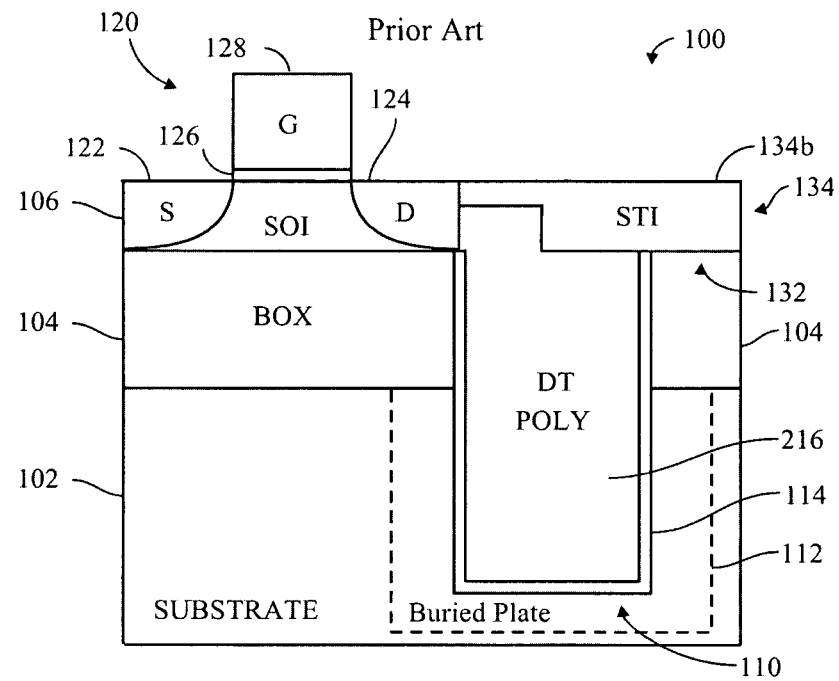

If shading or cross-hatching is used, it is intended to be of use in distinguishing one element from another (such as a cross-hatched element from a neighboring un-shaded element. It should be understood that it is not intended to limit the disclosure due to shading or cross-hatching in the drawing figures.

In some of the figures, particularly cross-sectional views of semiconductor devices in various stages of fabrication, some elements may be drawn with very straight edges intersecting with other edges at precise (such as 90-degree) angles, for illustrative clarity. One of ordinary skill in the art will appreciate that the edges may not be so straight, and the intersections may be rounded, due to the nature of the processes (such as etching) used to form the various elements of the semiconductor devices.

Figure 2:
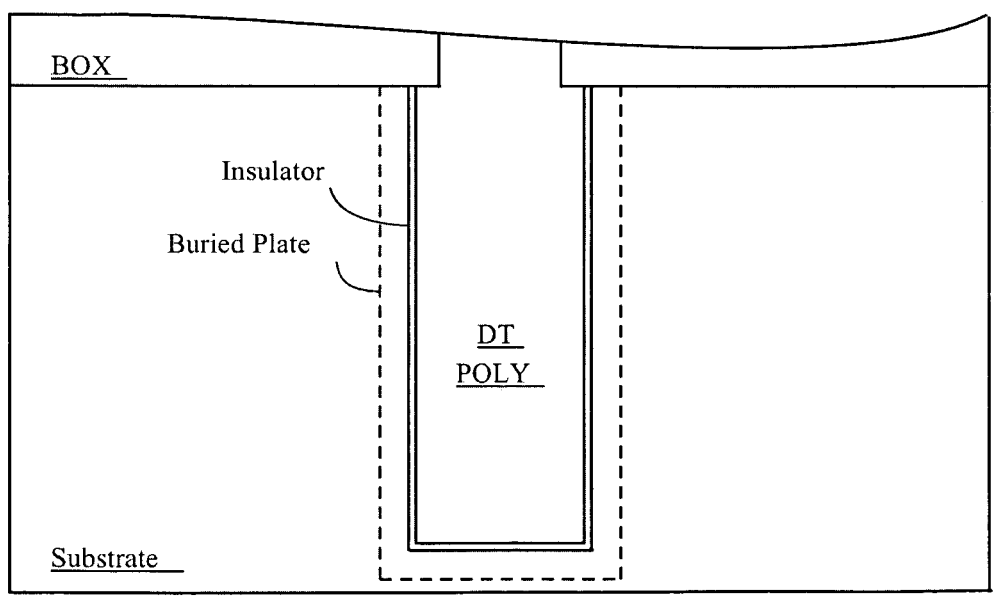

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

Conventional electronic components may be labeled with conventional schematic-style references comprising a letter (such as A, C, Q, R) indicating the type of electronic component (such as amplifier, capacitor, transistor, resistor, respectively) followed by a number indicating the iteration of that element (such as "1" meaning a first of typically several of a given type of electronic component). Components such as resistors and capacitors typically have two terminals, which may be referred to herein as "ends". In some instances, "signals" are referred to, and reference numerals may point to lines that carry said signals. In the schematic diagrams, the various electronic components are connected to one another, as shown. Usually, lines in a schematic diagram which cross over one another and there is a dot at the intersection of the two lines are connected with one another, else (if there is no dot at the intersection) they are typically not connected with one another.

In the drawings accompanying the description that follows, both reference numerals and legends (labels, text descriptions) may be used to identify elements. If legends are provided, they are intended merely as an aid to the reader, and should not in any way be interpreted as limiting.

FIG. 1 is a cross-sectional view of a FET, according to the prior art.

FIG. 2 is a cross-sectional view of a DRAM cell of the prior art.

FIGS. 3A-3G are cross-sectional views of a process for forming a DRAM cell, according to an embodiment of the invention.

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. Well-known processing steps and materials are generally not described in detail in order to avoid unnecessarily obfuscating the description of the present invention.

Throughout the descriptions set forth in this disclosure, lowercase numbers or letters may be used, instead of subscripts. For example Vg could be written Vg. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceding it, such as "Vs" (source voltage) or "H₂O" (water). For consistency of font size, such acronyms may be written in regular font, without subscripting, using uppercase and lowercase—for example "Vs" and "H2O".

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula SiO2. For example, silicon nitride (stoichiometrically Si3N4, often abbreviated as "SiN") may be referred to simply as "nitride".

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

The following figures, FIGS. 3A-3G, illustrate an exemplary process for forming a deep trench (DT) in an SOI substrate, while protecting the SOI layer. The deep trench (DT) may be used for a capacitor of a DRAM (including eDRAM) cell.

Figure 3A:
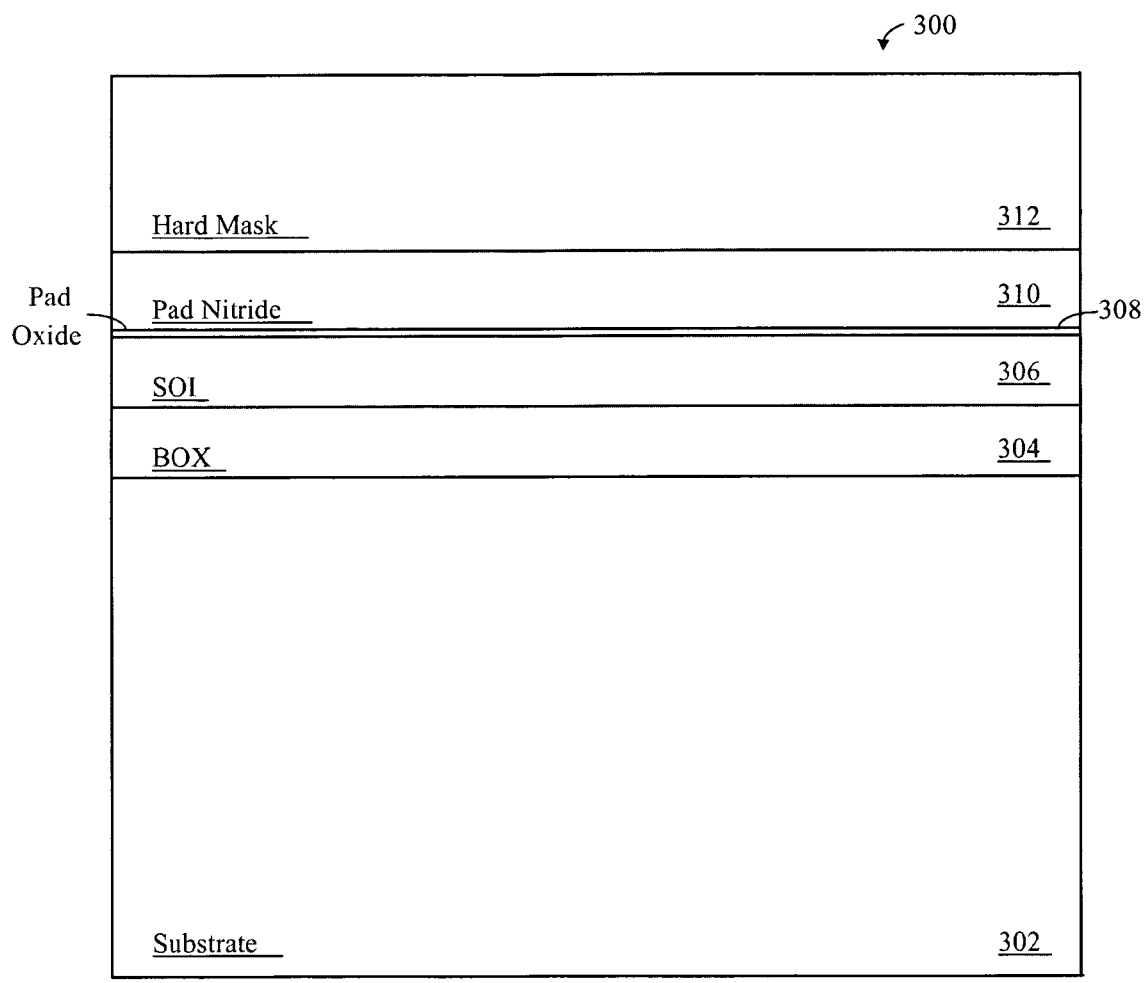

FIG. 3A illustrates an SOI substrate 300 with pad films and a hard mask, and represents first step in an overall process of providing SOI protection for implanted buried plate.

The overall substrate 300 is an SOI-type substrate having a layer 306 of silicon ("SOI") atop a buried oxide (BOX, insulator) layer 304, which is atop an underlying substrate 302 which may be a silicon substrate. The BOX layer 304 may have a thickness of 500-2500 Å (50-250 nm). The silicon (SOI) layer 306 may have a thickness of 50-200 Å (5-20 nm).

Pad films comprising a layer 308 of oxide and a layer 310 of nitride are disposed atop the SOI layer 306. The pad oxide layer 308 may have a thickness of 10-20 Å (1-2 nm), and the pad nitride layer 310 may have a thickness of 400-1500 Å (40-150 nm).

A hard mask 312, such as a layer of oxide, is disposed atop the pad films 310 and 308, and may have a thickness of 1000-12,000 Å (100-1200 nm). The hard mask 312 is typically oxide, rather than nitride, and oxide is used instead of resist because it tends to hold up better to the subsequent DT RIE step.

Figure 3B:
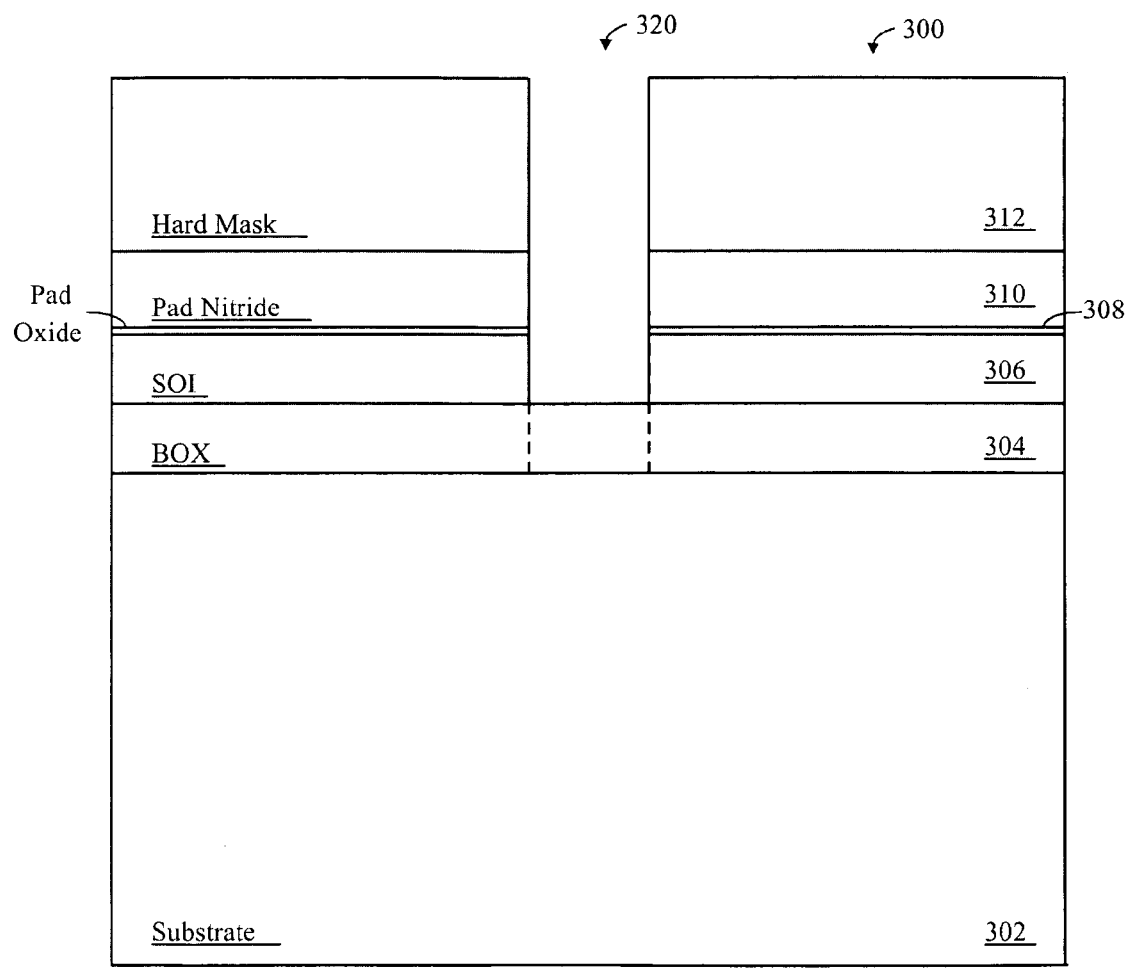

FIG. 3B illustrates a next step (DT litho, DT mask open) in the process of providing SOI protection for implanted buried plate.

One or more etches are performed to create (forming) an opening (initial trench) 320 extending through the hard mask 312, the pad films 310 and 308, and the SOI layer 306, stopping on the BOX 304. Alternatively, the etch may extend through the BOX 304, and stop on the underlying substrate 302, as shown in dashed lines.

In subsequent steps, this initial trench 320 will be extended into the substrate 302 to form a deep trench (DT), which may be bottle (or bottle-neck) trench into the substrate 302, for a trench capacitor, such as for a DRAM cell (including embedded DRAM).

The resulting initial trench 320, viewed from the top, may be generally rectangular, having one side dimension across the page (as viewed), and another side dimension into the page (as viewed).

The process of forming a deep trench in the substrate 302, will involve etching the substrate 302, which is silicon, which would also tend to etch away at the SOI layer 306, which is also silicon. It is generally not desirable to remove SOI 306, which is "active" area. Therefore, a solution is presented herein to protect the SOI layer 306 during deep trench etch.

Generally, first note that the SOI layer 306 has an opening through it, which is contiguous (coplanar, collinear) with the sidewall(s) (or opening) of the initial trench 320, or which may be considered to be a portion of the initial trench 320. The inner periphery of the SOI layer 306 is thus "exposed". As will become evident in subsequent steps, the inner periphery of the SOI layer 306 will be protected, so that during deep trench etch, it is not significantly etched.

Figure 3C:
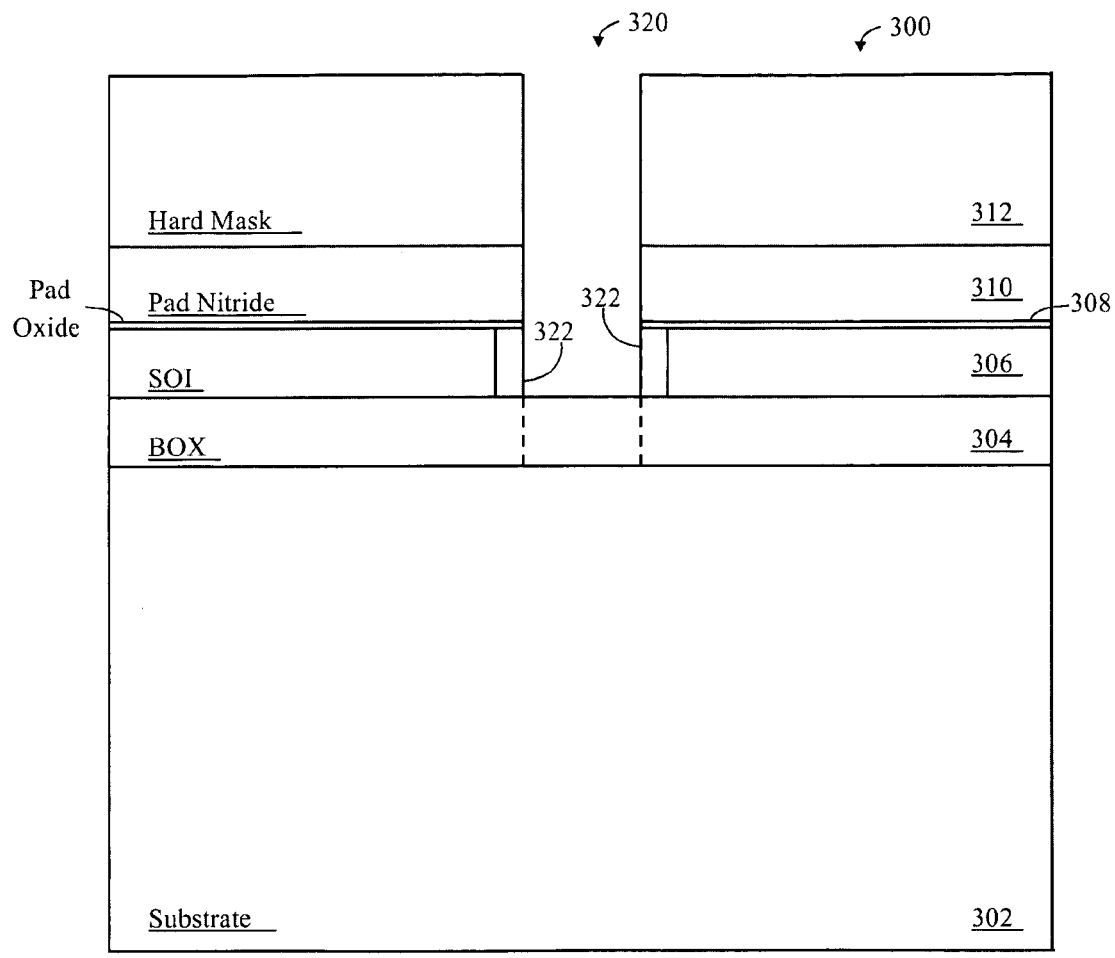

FIG. 3C illustrates a next step (protective oxidation) in the process of providing SOI protection for implanted buried plate.

The initial trench 320 was shown (FIG. 3B) stopping on the BOX 304, which is oxide. At this stage, an oxidation step (such as thermal oxidation) may be performed, which will grow a band (or ring, or collar) of oxide 322 in an inner peripheral area of the SOI layer 306, where it forms a portion of the wall(s) of the initial trench 320.

Although two reference numerals "322" are shown, it should be understood that the oxide structure (band) protecting the inner periphery of the SOI may be one continuous band surrounding the initial trench 320. The resulting oxide structure 322 on the inner periphery of the opening in the SOI 306 is used to protect the SOI 306 from subsequent trench (bottling) etch and plate implantation steps (described hereinbelow). Generally, during this step, no oxide will grow on the BOX 304, which is itself oxide. An advantage of a thermal oxidation is that it would grow only on the exposed silicon surfaces.

Alternatively, before thermal oxidation, the SOI layer 306 can be "pulled back", etched slightly away from the sidewall (s) of the initial trench 320, such as with ammonium hydroxide, to only etch the silicon of the SIO layer 306, thereby widening the opening through the SIO layer 306. This may be timed etch, etching back the SOI layer 306 by a controlled amount, such as about 5-10 nm.

Figure 3D:
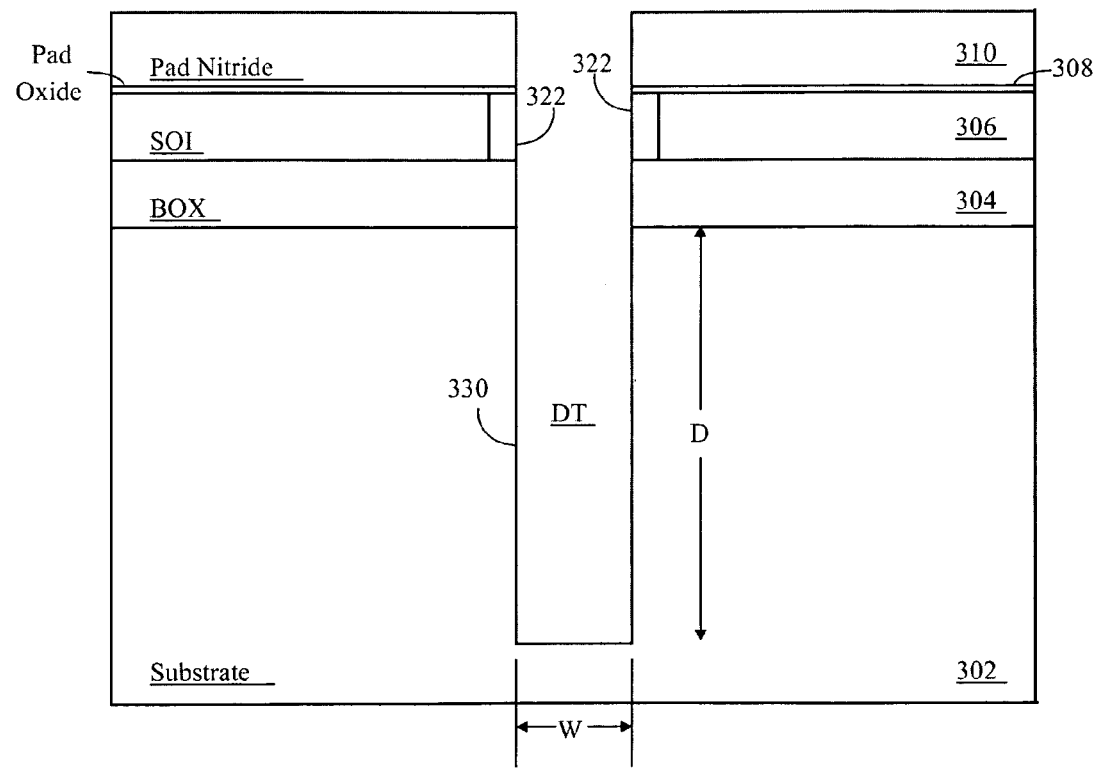

FIG. 3D illustrates a next step (DT silicon RIE, HDP oxide RIE) in the process of providing SOI protection for implanted buried plate.

In this step, a reactive ion etch (RIE) etch step may be performed to extend the initial trench 320 into the substrate 302, so as to become a deep trench (DT) 330 suitable for use in conjunction with a cell transistor in a DRAM cell. (If the BOX 304 was not previously opened, it will be opened by the RIE.) This step etch etches substantially vertically (directionally, anisotropically) into the substrate, extending the length of the initial trench 320, into the silicon substrate 302. Due to the substantially anisotropic nature of the etch, the oxide structure 322 protecting the SOI layer 306 will substantially avoid being compromised (damaged).

Directional RIE etching, for example, is relatively non-selective with regard to materials, and can etch through the BOX 304 (and thermal oxide covering the BOX, if any), and proceed to etch the silicon substrate 302. Due to the directionality of the etch, the ring 322 of silicon protecting the SOI 306 will remain relatively un-etched.

In the event that an etch process is used to create the deep trench (DT) which also etches away at the protective ring 322, the etch parameters may be adjusted (and directional effects of the etch taken into account) so that the ring 322 substantially remains in place during the etch, ultimately protecting the SOI layer. (This may include the protective oxide ring 322 intruding somewhat into the original trench 320, before RIE.)

The desired goal is to protect the SOI layer 306 during trench (bottle) etch in the silicon substrate 302, as well as to protect the SOI layer 306 during subsequent steps related to forming a buried plate for a cell capacitor in the deep trench (DT).

After reaching a desired depth "D", the deep trench etch stops and the hard mask 312 may be removed. The dimension "D" is illustrated as being the depth of that part of the resulting trench 320 which is within the silicon substrate 302. The width of the deep trench is, at this stage of the process, substantially uniform as it proceeds into the substrate 302, and is designated "W". The trench 320 shown in FIG. 3D may subsequently be referred to as the "original trench", or "pre-bottled" trench in the descriptions of following drawings.

The deep trench (DT) may have a width "W" of about 50 nm to 200 nm and a depth "D" of 1000 nm to 10000 nm, by way of example.

Figure 3E:
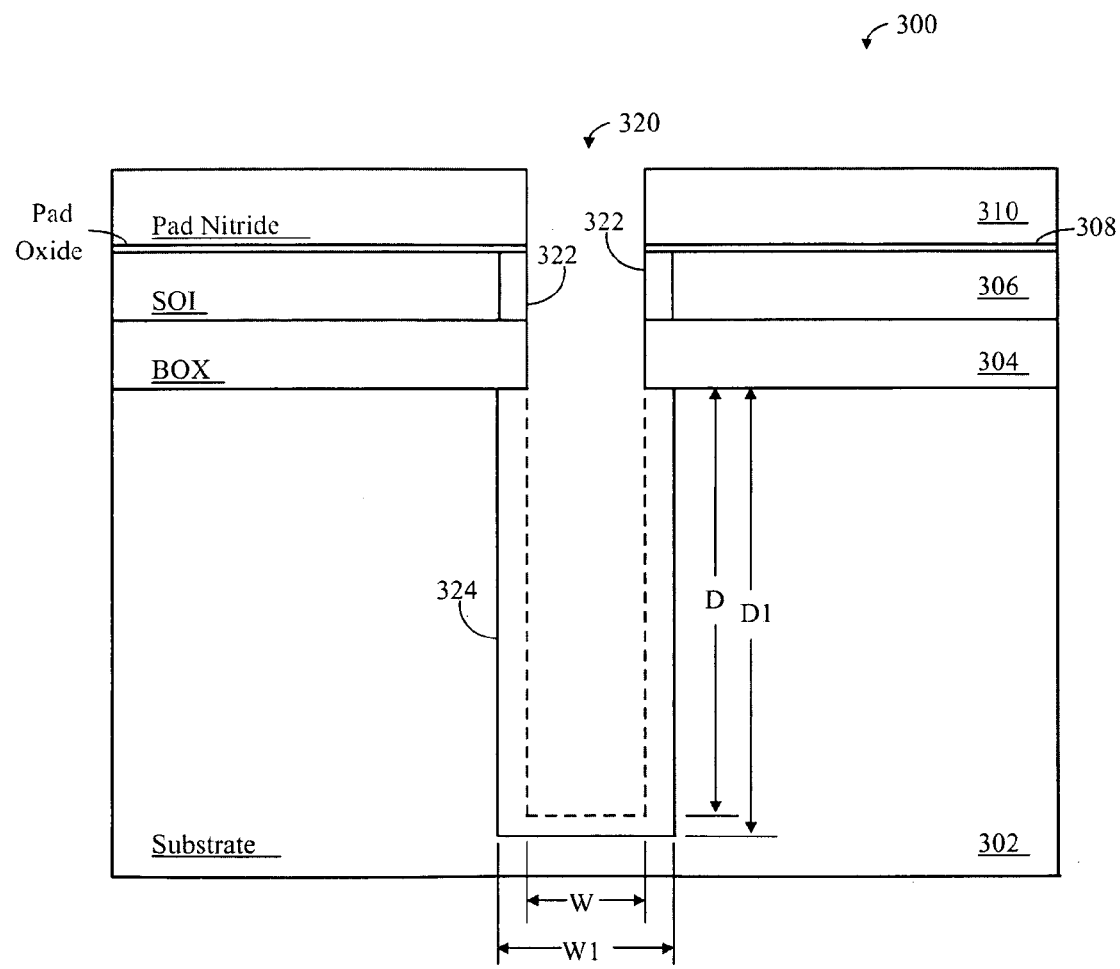

FIG. 3E illustrates a next step (DT bottle etch) in the process of providing SOI protection for implanted buried plate.

A bottle etch is performed, which is intended to widen the deep trench 330, such as by 10-40 nm. The bottle etch may also increase the depth of the trench 330. The bottle etch is designed to etch silicon preferentially to oxide (or nitride). This results in a widened portion 324 of the trench 330, and is indicated by the new width W1, within the underlying substrate 302. The original (pre-bottled) trench profile is shown in dashed lines ( - - - ).

In the process of widening the trench 330, the depth of the trench 330 may also be increased, and is indicated by the new depth D1. This may also be an increase of approximately 10-40 nm.

This results in the buried portion 330 of the overall trench (320 plus 330) having a wider cross-section than the upper portion 320 of the overall trench, and gives rise to the "bottle neck" nomenclature. (The "upper portion" of the trench may be considered to be that part of the overall trench extending through layers 304, 306, 308, 310.) The benefit of a bottleneck trench is that is has more surface area for forming a higher value capacitor, without compromising active area (the trench size extending through the SOI layer 306). In other words, a bottleneck trench is wide where it needs to be, and narrow where it needs to be.

Figure 3F:
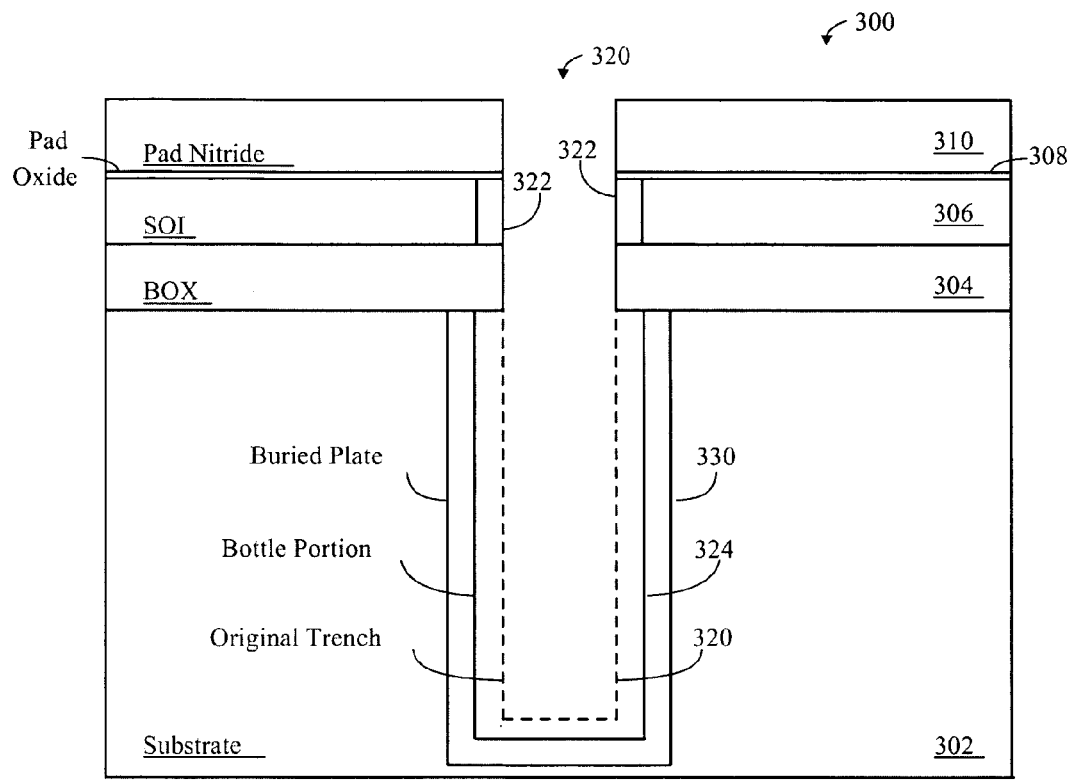

FIG. 3F illustrates a next step (Implant Plate Electrode) in the process of providing SOI protection for implanted buried plate.

The deep trench 330 (widened, or bottle portion 324 thereof) has sidewalls, and a dopant will be implanted, in any suitable manner (such as ion implantation, or gas phase doping) through the sidewalls, to form a doped area within the substrate 302, surrounding the widened trench 324, for use as a buried plate (electrode) 334 for a resulting capacitor.

Figure 3G:
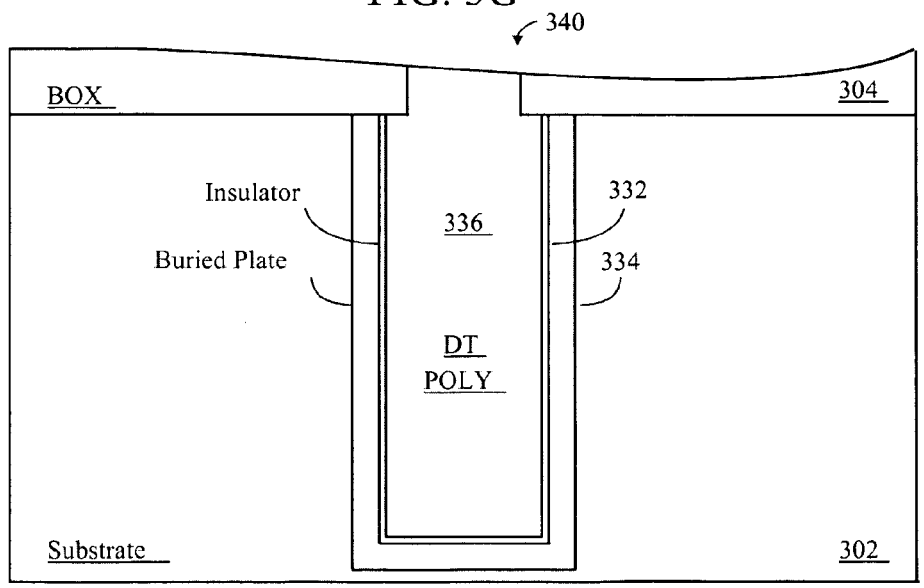

FIG. 3G shows a thin insulating layer 332 having been formed on the sidewall of the deep trench 320/324, and the trench is filled with doped poly 336, thereby completing a "deep trench" capacitor 340 which comprises two conductive elements—the buried plate 334 and the poly node 336—separated by an insulating layer 332. A top portion of the poly node 336 may join with or serve as one of the source or drain diffusions of an associated cell transistor for a DRAM (including embedded DRAM) cell using the trench capacitor 340 which has thus been formed, such as in the manner shown in FIG. 1.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of protecting an SOI layer during deep trench etch, comprising:
   commencing with an SOI layer atop a BOX layer which is atop an underlying substrate into which a deep trench will be formed;
   disposing an oxide layer atop the SOI layer;
   disposing a nitride layer atop the oxide layer;
   disposing a hard mask layer atop the nitride layer;
   forming an initial trench extending through the SOI layer, resulting in an opening in the SOI layer having an inner periphery;
   pulling back the SOI layer, via a timed ammonium hydroxide etch, thereby forming an opening in the SOI layer;
   forming a protective oxide structure on the opening in the SOI layer, wherein the protective oxide structure is bounded by the BOX layer and the oxide layer; and
   extending the initial trench into the substrate to form a deep trench via a reactive ion etch; and
   removing the hard mask layer.

2. The method of claim 1, wherein,
   the initial trench extends through the BOX layer to the underlying substrate.

3. The method of claim 1, wherein,
the oxidation step comprises thermal oxidation.

4. The method of claim 1, further comprising:
forming a buried plate in an area of the underlying substrate surrounding the deep trench.

5. The method of claim 4, further comprising:
forming a thin insulating layer on the sidewall of the deep trench.

6. The method of claim 5, further comprising:
filling the deep trench with doped poly.

7. The method of claim 1, further comprising:
performing a bottle etch to widen the deep trench within the underlying substrate.

8. The method of claim 7, further comprising:
performing ion implantation to form a buried plate surrounding the widened deep trench.

9. The method of claim 7, further comprising:
performing gas phase doping to form a buried plate surrounding the widened deep trench.

10. The method of claim 7, further comprising:
forming a thin insulating layer on the sidewall of the widened deep trench 11. The method of claim 10, further comprising:
filling the widened deep trench with doped poly.

12. The method of claim 1, further comprising:
performing ion implantation to form a buried plate surrounding the deep trench.

13. The method of claim 1, further comprising:
performing gas phase doping to form a buried plate surrounding the deep trench.

* * * * *